US 9,924,287 B2

United States Patent
Macours et al.

(10) Patent No.: US 9,924,287 B2
(45) Date of Patent: Mar. 20, 2018

(54) TEMPERATURE SENSING

(71) Applicant: NXP B.V., Eindhoven (NL)

(72) Inventors: Christophe Macours, Leuven (NL); Jan Paulus Freerk Huijser, Nijmegen (NL); Shawn Scarlett, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/209,852

(22) Filed: Jul. 14, 2016

(65) Prior Publication Data

US 2017/0026767 A1    Jan. 26, 2017

(30) Foreign Application Priority Data

Jul. 24, 2015    (EP) .................................... 15178325

(51) Int. Cl.
*H04R 3/00* (2006.01)
*H04R 29/00* (2006.01)
(Continued)

(52) U.S. Cl.
CPC .............. *H04R 29/003* (2013.01); *G01K 7/16* (2013.01); *G01K 7/427* (2013.01); *H03F 1/30* (2013.01);
(Continued)

(58) Field of Classification Search
CPC .......... H04R 3/00; H04R 3/007; H04R 9/022; H04R 29/003; H04R 2201/028; H04R 2499/11; H03F 1/30; H03F 1/52; H03F 2200/447; H03F 2200/462; H03F 2200/471; H03F 2200/468; G10K 7/17; G10K 7/427; G10K 2217/00
See application file for complete search history.

(56) References Cited

U.S. PATENT DOCUMENTS 4,980,920 A * 12/1990 Noro ......................... H03F 1/56
381/59
6,651,020 B2   11/2003 More
(Continued)

FOREIGN PATENT DOCUMENTS

EP          2538555 A1    12/2012
JP     2007331192 A1    12/2007

OTHER PUBLICATIONS

"Extrapolating exponential decay functions and temperature measurements"; retrieved from the Internet http://www.giangrandi.ch/soft/expextrap/expextrap.shtml ; 2 pages (Jul. 1, 2016).
(Continued)

*Primary Examiner* — Thang Tran

(57) ABSTRACT

A circuit and method for determining an ambient temperature for an electronic device having a loudspeaker are described. An amplifier drives the loudspeaker and first circuitry is configure to determine an overall temperature of the loudspeaker or the amplifier. Second circuitry is configured to determine a change in temperature of the loudspeaker or the amplifier resulting from power dissipated in the loudspeaker or the amplifier. Third circuitry is configured to subtract a signal representative of the change in temperature from a signal representative of the overall temperature and output a signal representative of the ambient temperature for the electronic device.

13 Claims, 3 Drawing Sheets

(51) Int. Cl.
*G01K 7/16* (2006.01)
*H03F 1/30* (2006.01)
*H03F 3/181* (2006.01)
*H04R 9/02* (2006.01)
*G01K 7/42* (2006.01)

(52) U.S. Cl.
CPC ............ *H03F 3/181* (2013.01); *H04R 3/007* (2013.01); *H04R 9/022* (2013.01); *H04R 29/001* (2013.01); *G01K 2217/00* (2013.01); *H03F 2200/468* (2013.01); *H04R 2201/028* (2013.01); *H04R 2499/11* (2013.01)

(56) References Cited

U.S. PATENT DOCUMENTS

| | | | |
|---|---|---|---|
| 7,570,118 B1* | 8/2009 | Gaboriau | H03F 1/523 330/10 |
| 2005/0163324 A1 | 7/2005 | Neunaber | |
| 2005/0288052 A1 | 12/2005 | Carter | |
| 2006/0171662 A1 | 8/2006 | Nagata et al. | |
| 2009/0257599 A1 | 10/2009 | Sand Jensen et al. | |
| 2010/0188136 A1* | 7/2010 | Baker | H03F 1/52 327/512 |
| 2011/0182434 A1* | 7/2011 | Martz | H04R 3/007 381/55 |
| 2011/0194705 A1 | 8/2011 | Gautama | |
| 2012/0020488 A1* | 1/2012 | Huijser | H04R 3/007 381/59 |
| 2012/0179303 A1 | 7/2012 | Anderson et al. | |
| 2012/0185202 A1 | 7/2012 | Aljabari | |
| 2013/0022207 A1* | 1/2013 | Luo | H03G 9/005 381/55 |
| 2013/0329898 A1 | 12/2013 | Wiliams et al. | |
| 2014/0126730 A1 | 5/2014 | Crawley et al. | |
| 2014/0161278 A1* | 6/2014 | Konno | H04R 5/04 381/94.2 |
| 2014/0169571 A1* | 6/2014 | Polleros | H04R 3/007 381/55 |
| 2014/0371944 A1 | 12/2014 | Vadakkanmaruveedu et al. | |
| 2015/0192477 A1 | 7/2015 | Saccetti et al. | |

OTHER PUBLICATIONS

Extended European Search Report for Patent Appln. No. 15178325.5 (dated Jan. 29, 2016).

Hsu, T. S. et al; Temperature Prediction of the Voice Coil of a Moving Coil Loudspeaker by Computer Simulation, Journal of the Acoustical Society of Japan (E). Tokyo, J P, vol. 21, No. 2; pp. 57-62 (Mar. 1, 2000).

Klippel, Wolfgang; "Nonlinear Modeling of the Heat Transfer in Loudspeakers"; J. Audio Eng. Soc., vol. 52, No. 1/2; 44 pages (Jan. 2, 2004).

Self, Douglas; "Audio Power Amplifier Design Handbook"; 5th Edition, Focal Press; retrieved from the internet http://files.books.elebda3.net/elebda3.net-gh-238.pdf; 19 pages (2013).

Zuccatti, Carlo; "Thermal Parameters and Power Ratings of Loudspeakers"; Journal Audio Engineering Society, vol. 38, No. 1/2; 6 pages (Jan./Feb. 1990).

\* cited by examiner

TEMPERATURE SENSING

CROSS-REFERENCE TO RELATED APPLICATIONS

This application claims the priority under 35 U.S.C. §119 of European patent application no. 15178325.5, Jul. 24, 2016 filed the contents of which are incorporated by reference herein.

The present specification relates to apparatus and methods, and in particular to circuits, systems and methods for ambient temperature sensing.

Temperature sensors are generally known and have a wide range of methods of operation and a wide range of applications. Many temperature sensors involve some physical property or other which is temperature dependent. Hence by determining changes in the physical property, or by determining some measurement of the physical property, changes in temperature or a measure of the temperature can be determined. Often, calibration or conversion factors are used to map between the measured physical property and the temperature in whatever units.

Both mechanical and electrical temperature sensors exist. Mechanical temperature sensors include various devices such as thermometers and bimetal strips. Electrical temperature sensors include various devices such as thermistors, thermocouples, resistance thermometers and solid state devices, such as silicon bandgap temperature sensors.

Temperature sensors may be used as part of a control circuit in which some further action is conditional on the sensed temperature. The control circuit may be mechanical, electrical or electro-mechanical. Sometimes a temperature sensor may be used simply to provide an indication of the temperature of a thing itself or the environment surrounding a thing.

For example, some electronic devices, such as smart phones and similar, may include an ambient temperature sensor to provide some measure of the temperature of the environment of the electronic device. The measured ambient temperature may be used for a number of purposes, for example to display the current temperature of the environment or as input to some other process or application, or for some other purpose or reason.

Ways of improving the simplicity and/or accuracy and/or reliability of ambient temperature sensing for electronic devices would be beneficial.

According to a first aspect of the present disclosure, there is provided a circuit for determining an ambient temperature for an electronic device having a loudspeaker, the circuit comprising: an amplifier for driving a loudspeaker; first circuitry configured to determine an overall temperature of the loudspeaker or the amplifier and output a signal representative of the overall temperature of the loudspeaker or the amplifier; second circuitry configured to determine a change in temperature of the loudspeaker or the amplifier resulting from power dissipated in the loudspeaker or the amplifier and output a signal representative of the change in temperature of the loudspeaker or the amplifier; and third circuitry configured to subtract the signal representative of the change in temperature from the signal representative of the overall temperature and output a signal representative of the ambient temperature for the electronic device.

The ambient temperature for an electronic device may be determined without using a dedicated temperature sensor.

In one or more embodiments, said second circuitry may include a thermal model of the loudspeaker or the amplifier. The thermal model may include a plurality of parameters. The thermal model may use a function to determine the temperature of the loudspeaker or amplifier. The function may include one or a plurality of parameters. At least one of the parameters may be the current supplied to, voltage of, power input or supplied to, or power generated or dissipated by, the loudspeaker or amplifier.

In one or more embodiments, the thermal model depends at least on the power supplied to or dissipated by the loudspeaker or the power supplied to or dissipated by the amplifier.

In one or more embodiments, the circuit may further comprise a first input in communication with an input of the amplifier and arranged to receive an audio signal to be amplified by the amplifier and a second input for receiving a reference signal. The reference signal may have a frequency less than the fundamental resonant frequency of a voice coil of the loudspeaker. The reference signal may have a frequency in the range of, for example, 0 Hz to 50 Hz. The reference signal may have a signal strength of less than 100 mV peak. The reference signal may have a sinusoidal waveform. The properties of the reference signal may vary depending on the properties of the loudspeaker and/or the application.

In one or more embodiments, said first circuitry may include circuitry configured to determine the DC resistance of a loudspeaker coil and circuitry arranged to determine the overall temperature of the loudspeaker based on the DC resistance of the loudspeaker coil.

In one or more embodiments, said first circuitry may include a temperature sensor in thermal communication with the amplifier. The temperature sensor may be arranged to measure the temperature of an integrated circuit amplifier part of the amplifier.

In one or more embodiments, said second circuitry may be in communication with an input of the amplifier and may be arranged to receive a signal indicative of the power of an audio signal to be amplified by the amplifier.

According to a second aspect of the present disclosure, there is provided a package comprising a lead frame and a semiconductor integrated circuit, wherein the semiconductor integrated circuit comprises the circuit of the first aspect of the present disclosure or any optional features thereof.

In one or more embodiments, the package or circuit may be a smart amplifier. The smart amplifier may include circuitry configured and/or arranged to measure the current supplied to a loudspeaker and/or the voltage across a loudspeaker.

According to a third aspect of the present disclosure, there is provided an electronic device, wherein the electronic device comprises: a loudspeaker; and the package of the second aspect or the circuit of the first aspect, and wherein the amplifier is connected to the loudspeaker.

In one or more embodiments, the electronic device may be a portable or mobile electronic device.

In one or more embodiments, the mobile or portable electronic device may be any one of a laptop, tablet, notebook, netbook, portable digital assistant (PDA), wireless or cellular telephone, a smart phone, a gaming device, a media player, a headset, a wearable device and similar.

According to a fourth aspect of the present disclosure there is provided a method of sensing an ambient temperature for an electronic device having an amplifier arranged to drive a loudspeaker, the method comprising: determining an overall temperature of the loudspeaker or the amplifier and generating a signal representative of the overall temperature of the loudspeaker or the amplifier; determining a change in temperature of the loudspeaker or the amplifier resulting from power dissipated in the loudspeaker or the amplifier and generating a signal representative of the change in temperature of the loudspeaker or the amplifier; and subtracting the signal representative of the change in temperature from the signal representative of the overall temperature to generate a signal representative of the ambient temperature for the electronic device.

In one or more embodiments, a thermal model of the amplifier or loudspeaker may be used in determining the change in temperature of the loudspeaker or the amplifier.

Preferred features of the first aspect may also be, or correspond to, or give rise to, preferred counterpart features of the fourth aspect.

BRIEF DESCRIPTION OF DRAWINGS

Example embodiments of the invention will now be described in detail, by way of example only, and with reference to the accompanying drawings, in which.

Similar items in the different Figures share like reference signs unless indicated otherwise.

Figure 1:
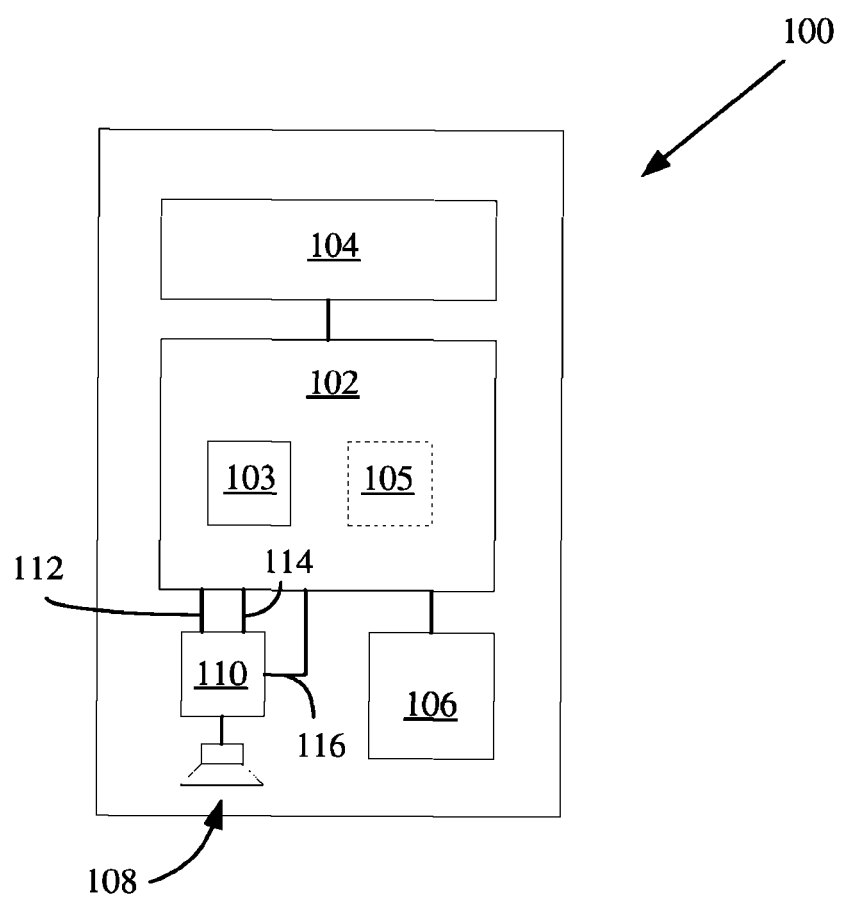
FIG. 1 shows a schematic block diagram of an electronic device.

With reference to FIG. 1 there is shown a schematic block diagram of an electronic device 100. The electronic device includes a variety of components, modules, systems and sub-systems depending on the specific purpose of the electronic device. These are not shown in detail in FIG. 1 so as not to obscure the invention, but will be understood by a persons of ordinary skill in the art. As illustrated in FIG. 1, electronic device 100 includes a main data processing system 102, which may include one or more data processors, such as central processing unit 103, and optionally one or more ancillary signal processing devices 105, such as a Digital Signal Processor (DSP), a microcontroller, a sensor hub, an audio codec, or similar. One or more memory devices, interfaces and buses for data and/or control signals may also be provided but are not shown for clarity of explanation. The electronic device may also include a user input/output or interface system 104 by which a user may interact with the electronic device. The user interface system may include various input and/or output devices, such as display devices, including touch screen displays, hard and soft keyboards, buttons, pointers, switches and/or other such common input and output devices. In embodiments in which the electronic device may communicate via a wireless network, the electronic device 100 may also include a wireless communications subsystem 106 via which the electronic communications device can interact with a communications network, such as a computer network and/or a wireless or cellular telephony network for example via Wi-Fi and/or a wireless telephony standard.

The electronic device may be a generally fixed or static electronic device, such as a television, desk top computer, games console, and similar, or may be a generally mobile or portable electronic device, such as a laptop, tablet, notebook, netbook, portable digital assistant (PDA), wireless or cellular telephone, particularly a smart phone, gaming device, media player, headset, wearable device and similar.

The electronic device also includes at least one loudspeaker 108 for providing audio output and so may also be considered a part of the overall user interface system 104. A circuit associated with the loudspeaker, illustrated by box 110, is also provided and provides, amongst other things, a loudspeaker drive signal. The loudspeaker is generally conventional and includes a voice coil which receives the loudspeaker drive signal and causes the loudspeaker cone to vibrate to generate the audio output. The circuit 110 also allows the ambient temperature of the electronic device to be measured. Although illustrated as a separate circuit in FIG. 1, some of the functionality of circuit 110 may be provided by other parts of the electronic device. For example in some embodiments, various calculations may be carried sometimes using one or more models of various electronic components. These calculations may be carried out using a dedicated hardware device, such as an ASIC, a specifically programmed device, a digital signal processor (DSP) or by software controlling a general purpose data processing device. Those may be provided by part of circuit 110 or by part of the main data processing system 102, such as the central processing unit 103 and/or the ancillary signal processor 105, or by a combination of those.

The circuit 110 is in communication via a first signal path 112 with the main data processing system 102 to receive electronic signals encoding or representing audio information to be output by the loudspeaker. The circuit 110 may also provide one or more signals back to the main data processing system over a second signal path 114. For example a signal representative of the measured ambient temperature may be returned to the main data processing system 102 over the second signal path. The circuit may also receive and/or send other control and/or data signals relating to operation of the circuit 110 to measure the ambient temperature over a third signal path 116 in communication with the data processing system 102.

Also, although FIG. 1 shows only a single loudspeaker, in some embodiments, the electronic device may have more than one loudspeaker. For example, some wireless telephones include a first loudspeaker for audio playback, either when playing music or in a speaker phone mode, and a second loudspeaker which provides the earpiece during a telephone conversation. Hence, the approach is not limited to electronic devices having only a single loudspeaker.

Various embodiments of the circuit 110 and speaker(s) 108 arrangement will now be described with reference to the following Figures and within the context of a smart phone. This is for clarity of explanation, and the approach is not limited in application only to smart phones. The approach may also be used in other types of electronic devices, as discussed above, and that have at least one loudspeaker.

Figure 2:
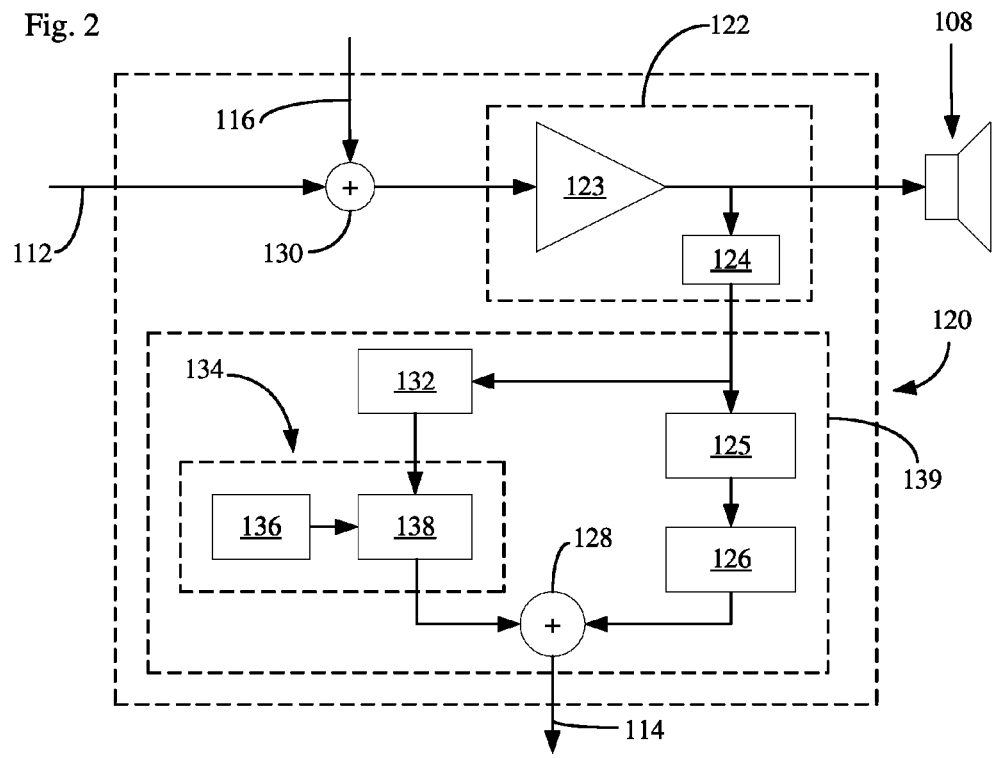
FIG. 2 shows a schematic block diagram of a first example embodiment of a circuit for determining an ambient temperature and which can be used in the electronic device illustrated in FIG. 1.

With reference to FIG. 2 there is shown a first embodiment of a circuit 120 that may be used with a loudspeaker 108 to determine the ambient temperature of the electronic device. The circuit 120 corresponds generally to circuit 110 of FIG. 1, although as noted above some of its functionality may be implemented by other parts of the data processing system 102. Circuit 120 includes an amplifier 122, and in particular a smart amplifier or smart power amplifier, the output of which is connected to the loudspeaker 108 so as to drive the loudspeaker 108. The smart amplifier 122 includes an amplifier 123 and also ancillary circuitry 124 configured to sense the voltage across the voice coil of the loudspeaker and also the current through the voice coil of the loudspeaker. The smart amplifier 122 may also include circuitry implementing a loudspeaker protection algorithm. An example of a suitable device for the smart amplifier 122 is the TFA9887UK as provided by NXP.

The amplifier 122 supplies signals representing the sensed current drawn by, and voltage across, the voice coil of the loudspeaker, to an impedance calculating circuit 125. The impedance calculating circuit supplies a signal representative of the measured impedance of the loudspeaker voice coil to a voice coil temperature estimating circuit 126. The voice coil temperature estimating circuit 126 then supplies a signal representative of the overall temperature of the voice coil to a first signal combiner 128. The voice coil temperature estimating circuit is configured to calculate an estimate of the voice coil temperature using the expression:

$$T_{VC} = T_0 + \frac{1}{\alpha_0}\left(\frac{R - R_0}{R_0}\right)$$

where $T_{VC}$ is the voice coil temperature in degrees Celsius, $T_0$ is a reference temperature (usually 20 degrees Celsius), $\alpha_0$ is the temperature coefficient of the voice coil material at $T_0$ (in 1/K), R is the voice coil DC resistance at temperature $T_{VC}$ (and which has been measured by circuit 125) and $R_0$ is the voice coil DC resistance at the reference temperature $T_0$. Hence, circuits 125 and 126 provide first circuitry configured to determine an overall temperature of the loudspeaker voice coil and output a signal representative of the overall temperature of the loudspeaker voice coil.

The audio signal input line 112 supplies any audio signal to be output by the amplifier to a second signal combiner 130. A second line 116 may optionally also supply a low frequency reference signal to the signal combiner 142. The output of the second signal combiner 130 is supplied to the input of the smart power amplifier 122.

Circuits 125 and 126 determine respectively the DC resistance of the voice coil and estimate the overall voice coil temperature, $T_{vc}$, from the voice coil DC resistance. Circuit 120 also includes a power determining circuit 132 which receives as input signals representing the current drawn by the loudspeaker voice coil and the voltage across the loudspeaker voice coil and which are supplied by circuit 124. Power determining circuit 132 determines the electrical power supplied to the loudspeaker from the measured values of voltage and current and supplies a signal representative of that electrical power to a thermal model circuit 134. The thermal model circuit 134 includes a circuit 136 or memory device storing values for various thermal parameters of a thermal model of the loudspeaker 108.

For example, the change in the temperature of the voice coil, $\Delta T_{vc}$, owing to power dissipation may be a function of the electrical power produced by the voice coil, $P_{vc}$, that may be calculated simply by multiplying the measured current and voltage of the voice coil. Generally speaking, $\Delta T_{vc}$ can be expressed as a function of $P_{vc}$, and a number of thermal parameters relating to the voice coil and the magnet of the actual loudspeaker 108, namely the voice coil resistance, $R_{vc}$, the voice coil capacitance, $C_{vc}$, the magnet resistance, $R_m$, and the magnet capacitance, $C_m$, of an equivalent circuit of a second-order thermal model of a loudspeaker. In other words, $\Delta T_{vc} = f(P_{vc}, R_{vc}, C_{vc}, R_m, C_m)$. This thermal model of a loudspeaker is described in greater detail in *Nonlinear Modeling of the Heat Transfer in Loudspeakers*, Wolfgang Klippel, J. Audio Eng. Soc., Vol. 52, No. 1/2, 2004, which is incorporated herein by reference in its entirety for all purposes. This is a non-limiting example of a thermal loudspeaker model and in other embodiments other thermal loudspeaker models may be used.

The various parameters used by the thermal model of the loudspeaker 108 are stored by circuit 136 and are provided to a calculation circuit 138 of the thermal model 134. The calculation circuit receives the thermal model parameters and the voice coil power, $P_{vc}$, and evaluates the function $f(P_{vc}, R_{vc}, C_{vc}, R_m, C_m)$ and outputs a signal representative of the change in voice coil temperature owing to power dissipation in the voice coil owing to the audio signal, $\Delta T_{vc}$. Hence, circuits 132 and 134 provide second circuitry configured to determine a change in temperature of the loudspeaker voice coil resulting from power dissipated in the loudspeaker and output a signal representative of the change in temperature of the loudspeaker voice coil.

The first signal combiner 128 combines the output of circuit 126, being a signal representative of the overall voice coil temperature, $T_{vc}$, and the negative value of the signal representative of $\Delta T_{vc}$ from the thermal model circuit 138. The overall temperature of the voice coil is generally given by $T_{vc} = T_a + \Delta T_{vc}$, i.e. the sum of the ambient temperature of the voice coil $T_a$ and any changes in temperature owing to power dissipation in the loudspeaker voice coil. Hence, the ambient temperature is given by $T_a = T_{vc} - \Delta T_{vc}$. Hence, the signal output on line 114 from signal combiner 128 is representative of the ambient temperature of the voice coil, $T_a$. Hence, signal combiner 128 provides third circuitry configured to subtract the signal representative of the change in temperature from the signal representative of the overall temperature and output a signal representative of the ambient temperature for the electronic device. Signal combiner may be implemented in different ways, for example by summing a first signal and negative value of a second signal, as in the illustrated embodiment, or by directly subtracting signals.

Figure 3:
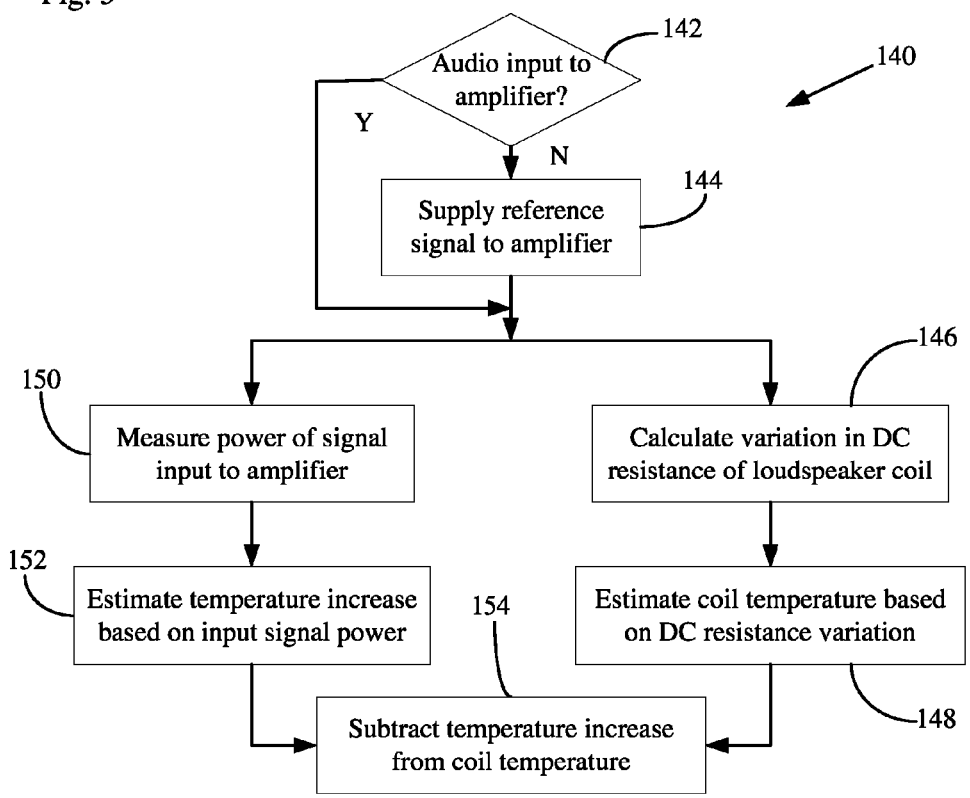
FIG. 3 shows a flow chart illustrating a method of determining an ambient temperature and which may use the circuit illustrated in FIG. 1.

FIG. 3 shows a flow chart illustrating a method 140 of determining the ambient temperature using the loudspeaker 108 and which can be carried out by circuit 140. At 142 it is determined whether any audio signal is being supplied to the circuit 120 on line 112. If the amplifier 122 has a dedicated mode of operation for measuring ambient temperature while not also playing audio, then a reference signal is supplied on line 116. During audio playback, the impedance of the voice coil may be calculated from the audio signal alone, provided the audio signal contains enough energy at the lower frequencies where the voice coil impedance is purely resistive. Also supplying a reference signal, either all the time or only when the audio signal does not contains enough energy at the lower frequencies, may allow more accurate and continuous measurements independently from the audio signal itself. Hence, the main system 102 may determine whether any audio signal is being output and if not, then supply the reference signal on line 116 to the second combiner 130. If an audio signal is being output, then the main system may also supply the reference signal on line 116, or may do so only if frequency analysis of the audio signal indicates that there is insufficient signal power at the lower frequencies.

If an audio signal is not currently being supplied to the amplifier on line 112, then at 144 a reference signal is supplied along line 116. If no reference signal is deemed to be needed at 142, then the audio signal alone may be supplied to the amplifier, if the audio signal has sufficient lower frequency signal components. Alternatively, the reference signal may also be supplied at the same time as the audio signal. Any reference signal on line 116 is supplied to the amplifier 122 and is then passed to the loudspeaker 108. The component of the signal supplied from the amplifier 122 to the loudspeaker 108 corresponding to the input reference signal is sufficiently low power that although the loudspeaker is driven any resulting component in the acoustic signal output by the loudspeaker is generally inaudible. The reference signal is generally sinusoidal, with a low amplitude (for example not more than 100 mV peak) and with a frequency lower than the fundamental resonant mode of the loudspeaker, for example less than about 50 Hz. However the exact properties of the reference signal will depend on the properties of the specific loudspeaker being used and/or the application.

Circuit 124 measures a signal indicative of the current drawn by the loudspeaker voice coil and also the voltage across the loudspeaker voice coil. By measuring the current and voltage at a low frequency, the approximate DC resistance of the voice coil of the loud speaker 108 can be determined by circuit 125 at 146 by dividing the magnitude of the measured voltage by the magnitude of the measured current, at the frequency of the reference signal.

At 146, the voice coil impedance calculating circuit 126 uses signals representative of the low frequency voltage and current to calculate the DC resistance of the voice coil. Alternatively, a parametric impedance model of the loudspeaker may be used and implemented by circuit 125. A parametric impedance model is an alternative way to determine the DC impedance at step 146. The speaker impedance is modelled using an adaptive filter whose parameters are adapted on the fly based on the input voltage and current signals. One of these parameters is the DC impedance of the voice coil and which can be output to the voice coil temperature estimating circuit 126.

At the same time, the measured voltage and current of the voice coil are supplied to the power calculation circuit 132, and, at 150, the power of the signal input to the loudspeaker voice coil is determined. The voice coil power, $P_{vc}$, is then supplied to the thermal model circuit 134, and at 152 the temperature change of the voice coil owing to power dissipation, $\Delta T_{vc}$, is estimated based on the voice coil power, and also using the thermal model parameters for the loudspeaker 108. At 154, the temperature change of the voice coil, $\Delta T_{vc}$, is subtracted from the overall voice coil temperature, $T_{vc}$, by the signal combiner 128, resulting in an output signal on line 114 representative of the ambient temperature.

In other embodiments, other thermal models may be used for the loudspeaker voice coil and changes in its temperature owing to electrical power dissipation in the voice coil. For example a linear thermal model may be used instead. A suitable linear thermal model is described in *Thermal Parameters and Power Ratings of Loudspeakers*, Zuccatti, J. Audio Eng. Soc., Vol. 38, No. 1/2, 1990, the contents of which are incorporated herein by reference in their entirety for all purposes. Specifically, the change in the voice coil temperature, $\Delta T_{vc}$ may be calculated by the thermal model using the dissipated power in the voice coil $P_{vc}$, using equation (7) on page 37 of *Thermal Parameters and Power Ratings of Loudspeakers*, Zuccatti, J.

As noted above, in different embodiments various parts of circuit 120 may be provided in different places. Circuits 125, 126, 132, 134 and 128, highlighted by dashed box 139, may largely implement calculations and so may be implemented by any suitable signal processing device or devices within the electronic device 100. For example, in some embodiments, a signal processor is provided as part of smart amplifier 122, and the circuits of 139 may be provided by a signal processor part of smart amplifier 122. In that case, the signal representative of the ambient temperature is then supplied over line 114 back to the main system 102 where it may be used by the central processing unit 103 or the sensor hub 105 when present. In other embodiments, some or all of the circuits of 139 may be implemented in a sensor hub 105 (when provided), the central processing unit 103, or some other signal processing unit or microcontroller within the electronic device 100, e.g., in an audio codec.

Figure 4:
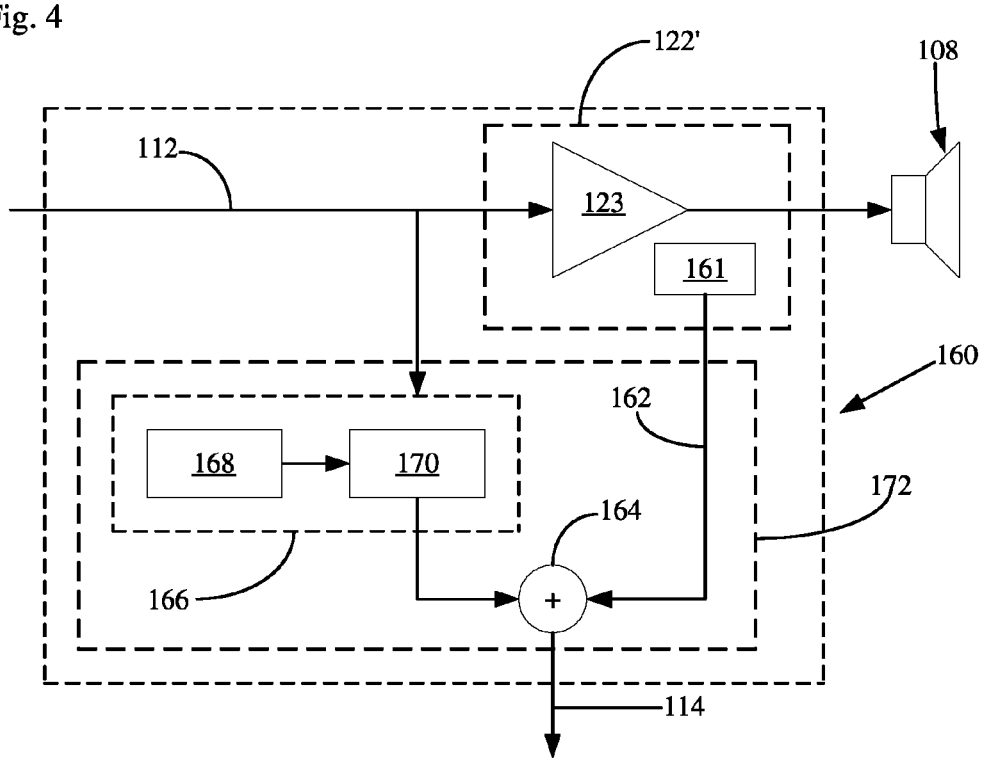
FIG. 4 shows a schematic block diagram of a second example embodiment of a circuit for determining an ambient temperature and which can be used in the electronic device illustrated in FIG. 1.

With reference to FIG. 4 there is shown a second embodiment of a circuit 160 that may be used with a loudspeaker 108 to determine the ambient temperature of the electronic device. The circuit 160 corresponds generally to circuit 110 of FIG. 1, although as noted above some of its functionality may be implemented by other parts of the data processing system 102. Circuit 160 includes an amplifier 122', the output of which is connected to the loudspeaker so as to drive the loudspeaker 108. In particular the amplifier 122' includes an amplifying stage 123 and also temperature sensing circuitry 161 configured to provide an output on line 162 which provides a signal representative of the temperature of the amplifier itself. A suitable device for the power amplifier 122' is, for example, a TFA9887UK as provided by NXP Semiconductors. Temperature sensing circuitry 161 and line 162 provide first circuitry configured to determine an overall temperature of the amplifier and output a signal representative of the overall temperature of the amplifier. The line 162 from the amplifier 122' is connected to a signal combiner 164 and supplies a signal representative of the overall temperature, $T_{amp}$, of the integrated circuit of the amplifier stage 123. The audio signal input line 112 is in communication with the input of the amplifier 122' and also with a thermal model circuit 166 of the amplifier. The thermal model circuit 166 includes a parameter storing portion 168 which stores various parameters relating to the amplifier 122' and which are used by the thermal model. A thermal model calculation part 170 receives a signal representative of power of the signal being input to the amplifier and determines a change in temperature of the amplifier, $\Delta T_{amp}$, owing to power dissipated in the amplifier when amplifying the input signal, and outputs a signal representative of the change in temperature of the amplifier, the negative value of which is supplied to the signal combiner 164. Hence, thermal model circuit 166 provides second circuitry configured to determine a change in temperature of the amplifier resulting from power dissipated in the amplifier and output a signal representative of the change in temperature of the amplifier.

Similarly to the approach described above, the temperature of the amplifier is generally given by $T_{amp} = T_a + \Delta T_{amp}$, i.e. the sum of the ambient temperature of the amplifier $T_a$ and any changes owing to power dissipation in the amplifier, $\Delta T_{amp}$. Hence, the ambient temperature is given by $T_a = T_{amp} - \Delta T_{amp}$. Hence, the signal output on line 114 from signal combiner 164 is representative of the ambient temperature of the amplifier, $T_a$. Hence, signal combiner 164 provides third circuitry configured to subtract the signal representative of the change in temperature from the signal representative of the overall temperature and output a signal representative of the ambient temperature for the electronic device.

Figure 5:
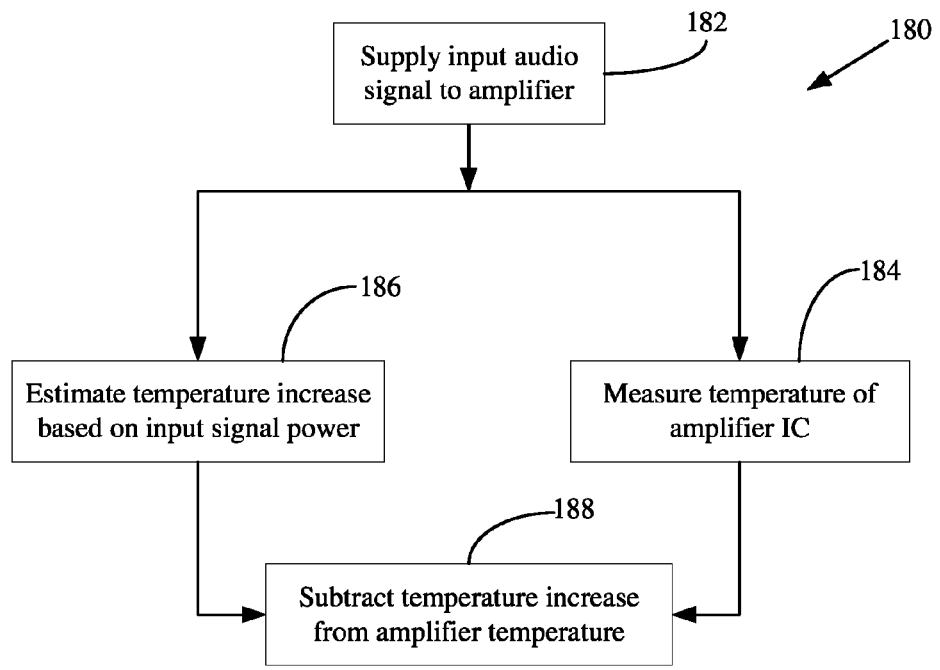
FIG. 5 shows a flow chart illustrating a method of determining an ambient temperature and which may use the circuit illustrated in FIG. 4.

FIG. 5 shows a flow chart illustrating a method 180 of determining the ambient temperature and which can be carried out by circuit 160. At 182 an audio signal is supplied to the circuit on line 112 that is to be amplified by the amplifier and supplied to the loudspeaker 108. At 184, the temperature of the amplifier IC of the smart power amplifier 122' is measured and a signal representative of the overall temperature of the amplifier is supplied to the signal combiner. A signal representative of the power of the audio signal input to the amplifier is supplied to the amplifier thermal model circuit 166 and at 186 the change in temperature of the amplifier IC is estimated using a thermal model of the amplifier IC and based on the power of the input signal. A non-limiting example of a suitable thermal model of the amplifier is shown and described in FIG. 15.6 on page 15.5 of "Audio Power Amplifier Design Handbook", 5$^{th}$ Edition, by Douglas Self, Focal Press, 2013, the entire content of which is incorporated herein by reference for all purposes. At 188 the ambient temperature is determined by subtracting the change in the amplifier temperature owing to power dissipation from the overall temperature of the amplifier to give the ambient temperature as effectively sensed by the amplifier IC of the power amplifier 122'.

Similarly to the first example embodiment, in different embodiments various parts of circuit 160 may be provided in different places. Circuits 166 and 164, highlighted by dashed box 172, may largely implement calculations and so may be implemented by any suitable signal processing device or devices within the electronic device 100. For example, in some embodiments, a signal processor is provided as part of amplifier 122', and the circuits of 172 may be provided by a signal processor part of amplifier 122'. In other embodiments, some or all of the circuits of 172 may be implemented in a sensor hub 105 (when provided), the central processing unit 103, or some other signal processing unit or microcontroller within the electronic device 100, e.g., in an audio codec.

In another embodiment, the circuits of FIGS. 2 and 4 can be combined and the ambient temperature obtained from the loudspeaker voice coil temperature and the ambient temperature obtained from the amplifier IC temperature can be averaged to provide a more accurate indication of the ambient temperature.

If a dedicated temperature sensor for ambient environment measurements is included in a smart phone, then such sensors tend to be housed inside a compartment of a microphone and in communication with ambient air through a small channel, usually a small hole or channel for the microphone. There is usually a filter in the air path to block dust entering the sensor. The long air path and filter make it more difficult for ambient air to diffuse into, or out from, the sensor, and therefore the response time of the sensors becomes significantly longer than that of open and stand-alone sensors. This is one of the reasons, next to cost, why very few smartphones are equipped with such sensors.

A loudspeaker of an electronic device can be an advantageous alternative, or addition, to a dedicated ambient temperature sensor in an electronic device. The loudspeaker is a standard component and often is inherently in physical contact with ambient air through its front and back acoustical ports. Also a loudspeaker is often located in a dedicated enclosure which limits heat transfer from nearby components such as CPUs or displays.

When the loudspeaker is operated to reproduce sound, the loudspeaker coil will naturally heat up and its temperature will no longer correspond to the ambient air temperature. Hence, in some embodiments, when using the loudspeaker coil to sense ambient temperature, account is taken for the thermal effects of the driving signal.

Similarly, when the amplifier is operated to reproduce sound, the amplifier will naturally heat up and its temperature will no longer correspond to the ambient air temperature. Hence, in some embodiments, when using the amplifier to sense ambient temperature, account is taken for the thermal effects of amplifying the driving signal.

The circuits described above, by way of non-limiting example only, provide a number of features, such as: compensating for the own speaker temperature increase due to the driving signal; compensating for the own amplifier temperature increase due to amplifying the driving signal; using information from electrical components to obtain a more accurate ambient temperature estimate; and adaption to provide more accurate estimates of ambient temperature under different operating conditions. Circuits implementing these features in different ways and/or different combinations of these features may also be realised and will be apparent to a person of ordinary skill in the art from the above description.

The circuits can be used in any electronic device including at least one loudspeaker, and are particularly suited for mobile or portable electronic devices whose environments are more likely to change than stationary or static electronic devices. For example, the circuits may be beneficial in various mobile devices including, by way of non-limiting example only, smartphones, tablets, laptops, PDAs, wearable devices, watches, headsets and similar, that have at least one loudspeaker.

In some embodiments, the various circuits described above may be provided as one or more semiconductor packages. The or each semiconductor package may include a die of semiconductor material which provides an integrated circuit implementation of the circuit for determining ambient temperature and a lead frame, and encapsulated in a packaging material.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The instructions and/or flowchart steps in the above Figures can be executed in any order, unless a specific order is explicitly stated or required. Also, those skilled in the art will recognize that while one example set of instructions/method has been discussed, the material in this specification can be combined in a variety of ways to yield other examples as well, and are to be understood within a context provided by this detailed description.

While the disclosure is amenable to various modifications and alternative forms, specifics thereof have been shown by way of example in the drawings and described in detail. It should be understood, however, that other embodiments, beyond the particular embodiments described, are possible as well. All modifications, equivalents, and alternative embodiments falling within the scope of the appended claims are covered as well.

The invention claimed is:

1. A circuit for determining an ambient temperature for an electronic device having a loudspeaker, the circuit comprising:
   an amplifier for driving configured to drive a loudspeaker;
   first circuitry configured to
      determine an overall temperature of the loudspeaker or the amplifier and output a signal representative of the overall temperature of the loudspeaker or the amplifier;

second circuitry configured to
determine a change in temperature of the loudspeaker or the amplifier resulting from power dissipated in the loudspeaker or the amplifier and
output a signal representative of the change in temperature of the loudspeaker or the amplifier; and third circuitry configured to
subtract the signal representative of the change in temperature from the signal representative of the overall temperature and
output a signal representative of the ambient temperature for the electronic device based on the subtraction.

2. The circuit as claimed in claim 1, wherein said second circuitry includes a thermal model of the loudspeaker or the amplifier.

3. The circuit as claimed in any of claims 2, wherein the thermal model depends at least on the power dissipated by the loudspeaker or the power dissipated by the amplifier.

4. The circuit as claimed in claim 1 and further comprising
a first input in communication with an input of the amplifier and arranged to receive an audio signal to be amplified by the amplifier and
a second input arranged to receive a reference signal having a frequency less than a fundamental resonant frequency of a voice coil of the loudspeaker.

5. The circuit as claimed in claim 1, wherein said first circuitry includes circuitry configured to determine the DC resistance of a loudspeaker coil and circuitry configured to determine the overall temperature of the loudspeaker based on the DC resistance of the loudspeaker coil.

6. The circuit as claimed in claim 1, where said first circuitry includes a temperature sensor in thermal communication with the amplifier.

7. The circuit as claimed in claim 6, wherein said second circuitry is in communication with an input of the amplifier and is arranged to receive a signal indicative of the power of an audio signal to be amplified by the amplifier.

8. A package comprising a lead frame and a semiconductor integrated circuit, wherein the semiconductor integrated circuit comprises the circuit of claim 1.

9. The package as claimed in claim 8, wherein the package is a smart amplifier.

10. The circuit of claim 1, wherein the circuit for determining an ambient temperature is included in a mobile electronic device.

11. The circuit of claim 10, wherein the mobile electronic device is a mobile telephone.

12. A circuit for determining an ambient temperature for an electronic device having a loudspeaker, the circuit comprising:
an amplifier for driving a loudspeaker;
first circuitry configured to
determine an overall temperature of the loudspeaker or the amplifier and
output a signal representative of the overall temperature of the loudspeaker or the amplifier;
second circuitry configured to
determine a change in temperature of the loudspeaker or the amplifier resulting from power dissipated in the loudspeaker or the amplifier and
output a signal representative of the change in temperature of the loudspeaker or the amplifier;
third circuitry configured to subtract the signal representative of the change in temperature from the signal representative of the overall temperature and output a signal representative of the ambient temperature for the electronic device;
a first input in communication with an input of the amplifier and arranged to receive an audio signal to be amplified by the amplifier; and
a second input arranged to receive a reference signal having a frequency less than a fundamental resonant frequency of a voice coil of the loudspeaker.

13. A circuit for determining an ambient temperature for an electronic device having a loudspeaker, the circuit comprising:
an amplifier configured to drive a loudspeaker;
first circuitry configured to
determine an overall temperature of the loudspeaker or the amplifier and
output a signal representative of the overall temperature of the loudspeaker or the amplifier;
second circuitry configured to
determine a change in temperature of the loudspeaker or the amplifier resulting from power dissipated in the loudspeaker or the amplifier and
output a signal representative of the change in temperature of the loudspeaker or the amplifier; and
third circuitry configured to
subtract the signal representative of the change in temperature from the signal representative of the overall temperature and
output a signal representative of the ambient temperature for the electronic device based on the subtraction;
wherein the amplifier is configured to receive an audio signal and a reference signal; and
wherein the circuit for determining the ambient temperature is configured to measure the ambient temperature while the reference signal is driving the loudspeaker.

* * * * *